United States Patent [19]
Bothra et al.

[11] Patent Number: 5,880,519
[45] Date of Patent: Mar. 9, 1999

[54] MOISTURE BARRIER GAP FILL STRUCTURE AND METHOD FOR MAKING THE SAME

[75] Inventors: Subhas Bothra; Ling Q. Qian, both of San Jose, Calif.

[73] Assignee: VLSI Technology, Inc., San Jose, Calif.

[21] Appl. No.: 856,949

[22] Filed: May 15, 1997

[51] Int. Cl.$^6$ ............ H01L 23/58; H01L 23/69; H01L 23/52
[52] U.S. Cl. ............ 257/641; 257/640; 257/649; 257/637; 257/760
[58] Field of Search .................. 257/787, 640, 257/641, 649, 637, 760

[56] References Cited

U.S. PATENT DOCUMENTS

| | | | |
|---|---|---|---|
| 3,745,647 | 7/1973 | Bokely, III | 257/640 |
| 5,440,168 | 8/1995 | Nishimura et al. | 257/640 |
| 5,468,986 | 11/1995 | Yamanashi | 257/640 |

FOREIGN PATENT DOCUMENTS

| | | | |
|---|---|---|---|
| 60-244057 | 12/1985 | Japan | 257/641 |
| 63-52476 | 3/1988 | Japan | 257/641 |
| 4-316370 | 11/1992 | Japan | 257/641 |

*Primary Examiner*—Mahshid D. Saadat
*Assistant Examiner*—Jhihan B. Clark
*Attorney, Agent, or Firm*—Hickman & Martine, LLP

[57] ABSTRACT

Disclosed is a method for making a passivation coated semiconductor structure. The method includes providing a substrate having a metallization line patterned over the substrate. The metallization line defining at least one interconnect feature having a first thickness, and depositing a first silicon nitride barrier layer having a second thickness over the substrate and the metallization line. The method further including applying an oxide material over the first silicon nitride barrier layer that overlies the substrate and the metallization line. The oxide application includes a deposition component and a sputtering component, and the sputtering component is configured to remove at least a part of an edge of the first silicon nitride layer. The edge is defined by the metallization line underlying the first silicon nitride layer. Further, the method includes depositing a second silicon nitride layer over the oxide material that is applied by the deposition component and the edge of the first silicon nitride layer sputtered by the sputtering component to establish a moisture and mobile ion repelling barrier between the second and first silicon nitride layers.

10 Claims, 8 Drawing Sheets

MOISTURE BARRIER GAP FILL STRUCTURE AND METHOD FOR MAKING THE SAME

BACKGROUND OF THE INVENTION

1. Field of the Invention

The present invention relates generally to integrated circuits and, more particularly, to moisture barrier gap fill semiconductor structures and methods for making the same.

2. Description of the Related Art

In the fabrication of semiconductor devices, it is of critical importance that individual devices formed over various layers on a semiconductor substrate are sealed from ambient conditions as well as providing mechanical support for subsequent layers. Conventionally, passivation layers are applied over the topmost surface of integrated circuits to ensure the integrity of the possibly hundreds or thousands of devices and patterned metallization lines that will eventually underlie the passivation layers. Accordingly, the passivation layer must be well suited to completely blanket the top surface of the semiconductor devices. A commonly used passivation layering technique includes depositing an initial phosphorus doped plasma enhanced chemical vapor deposition (PECVD) oxide layer followed by a PECVD silicon nitride layer.

The phosphorus doped oxide layer is used because it is known to absorb moisture and prevent it from migrating and contacting the gate oxides of the underlying active devices as well as the interconnect metallization lines. The silicon nitride layer, on the other hand, is deposited over the phosphorous doped oxide because of its moisture repelling ability. Therefore, a typical passivation layering technique uses the silicon nitride layer as a topmost seal to protect the underlying devices in the first place, and the phosphorous doped oxide as an absorbing shield to prevent any moisture that may have penetrated the silicon nitride layer from migrating to other areas of the semiconductor device.

With this in mind, FIG. 1A is a three-dimensional view of a substrate 10 having a multi-layer passivation 18 blanketed over a pair of metallization lines 12 and 14. For ease of understanding, other well known intermediate dielectric layers that may lie under the pair of metallization lines 12 and 14 will not be described herein. Accordingly, the pair of metallization lines 12 and 14 are patterned over the surface of substrate 10 such that a 90 degree angle is formed when the metallization lines 12 and 14 are patterned in an "L" shape. Because the pair of metallization lines 12 and 14 define a narrow gap separation 15 which may be about 0.5 microns for 0.35 micron technology processes, 0.4 microns for 0.25 micron technology processes, and 0.3 microns for 0.18 micron technology processes, the multi-layer passivation 18 unfortunately tends to produce well known pinch-offs 16 (e.g., also known as voids).

As shown, pinch-off 16 will traverse in parallel along the length of metallization lines 12 and 14 thereby defining a hollow tubular pinch-off region between metallization lines 12 and 14. Fortunately, pinch-off 16 will not provide a moisture paths down into the hollow tubular pinch-off region when the tubular pinch-off regions are defined between lines having minimal geometric bends. However, when the metallization lines 12 and 14 are patterned with more substantial geometrical bends (e.g., the illustrated 90 degree bend), a through gap 16' is unfortunately formed down into the hollow tubular pinch-off region. As a result, through gap 16' provides a channel for moisture and contaminants to penetrate the passivation layer and diffuse through to the underlying insulating layers, metallization and active devices. Further, when a patterning photoresist liquid is coated over the topmost surface of substrate 10, the coated photoresist liquid will typically flow in through gap 16' and become trapped inside of the hollow tubular pinch-off region.

Once the photoresist liquid has served its patterning purpose, the photoresist material is removed in a well known photoresist cleaning operation. However, the cleaning operation will typically be unable to remove the trapped photoresist material lying in the hollow tubular pinch-off region. Consequently, when the pair of metallization lines 12 and 14 and the multi-layer passivation 18 are subsequently annealed to temperatures ranging up to about 400° C., the trapped photoresist material lying within pinch-off 16 will naturally release energy by outgassing the liquid photoresist. In some cases, the outgassing may cause a substantial burst of energy near and around through gap 16'.

FIG. 1B is a top view of the multilayer passivation 18 that coats the pair of metallization lines 12 and 14 of FIG. 1A. This top view clearly illustrates the possible damage that may occur to multi-layer passivation 18 when the elevated temperatures of the annealing operation are applied to substrate 10. Once the multi-layer passivation 18 becomes damaged to the illustrated magnitude, the multi-layer passivation 18 will no longer serve its intended purpose of protecting the underlying devices and metallization lines 12 and 14 from moisture damage and mobile ions.

To avoid these problems, it has become common practice to deposit thinner multilayer passivations 18 over an integrated circuit and its associated metallization interconnect lines in an attempt to avoid creating pinch-offs between closely spaced features. Although pinch-offs are no longer created, it has been observed that applying thinner multi-layer passivations 18 has not been sufficient to adequately protect the underlying features during subsequent etching and deposition process steps. At 0.25 micron technology and 0.18 micron technology, this approach may not be extended as the spaces between metal lines approach 0.2 microns. To avoid pinch-offs, extremely thin layers have to be used. These thinner multi-layer passivations 18 are too weak to provide suitable mechanical protection to the chip from subsequent process steps needed for packaging the chips, and are also too thin to provide reliable barriers to moisture and mobile ions. Further, the thinner multilayer passivations 18 have been in some cases too weak to provide suitable mechanical support for features that may be subsequently patterned over the multi-layer passivation 18.

Another method for preventing pinch-offs between features is to use a high density plasma chemical vapor deposition (HDPCVD) oxide deposition process. As is well known, HDPCVD oxide deposition has been found to be excellent in filling narrow gaps. As a result, the pinch-offs 16 as well as the through gaps 16' of FIG. 1A may be substantially avoided.

FIG. 1C is a cross-sectional view of a semiconductor device having an oxide layer deposited using an HDPCVD process to prevent possible pinch-offs between closely spaced apart features. As shown, a substrate 24 has a metallization line 26 patterned thereon, and an oxide layer 28 deposited over substrate 24 and metallization line 26 using an HDPCVD process. A silicon nitride layer 29 is then deposited over the oxide layer 28 in an attempt to protect the underlying features from moisture and mobile ions. Although the HDPCVD deposited oxide layer 28 provides excellent gap filling performance, oxide layer 28 is not a good barrier against moisture. Therefore, once a patterning and etching step (i.e., etching through silicon nitride layer 29 and oxide layer 28) is performed to define an electrical contact hole to metallization line 26, a moisture and mobile ion path 30 is created through oxide layer 28. The moisture and mobile ion path 30 therefore potentially produces an integrated circuit structure that may be vulnerable to malfunctions and poor performance.

As is well known, a large number of semiconductor devices are typically not packaged in hermetically sealed containers in order to reduce costs, or decrease the size of the packaged device. Therefore, if moisture finds its way into oxide layer 28 through path 30, the gate oxide materials (not shown) of neighboring active devices may absorb the moisture. Unfortunately, when the gate oxides are exposed to moisture, the turn-on threshold voltage of some active devices may shift, while leaving other active devices with non-shifted turn-on threshold voltages. As such, if the turn-on threshold voltages of some active devices are shifted, the integrated circuit devices will have varying turn-on threshold voltages that will unfortunately cause a decline in performance and may cause the circuits deterioration over time. Still further, when the inter-metal oxides absorb moisture, these oxides will unfortunately become brittle and weak which may expose them to performance and functionality deteriorating oxide cracks.

As mentioned above, path 30 may also be a convenient entry way for mobile ions produced by a variety of fabrication and packaging chemicals (e.g., sodium). Typically, mobile ions are introduced during the latter stages of integrated circuit manufacturing where soldering byproducts and handling contaminants are abundant. Once mobile ions find there way into oxide layer 28, these mobile ions may migrate into the gate oxides of neighboring devices, which may also disadvantageously introduced the aforementioned differences in turn-on threshold voltages.

In view of the foregoing, there is a need for semiconductor structures having an excellent barrier against moisture and mobile ions. There is also a need for a method of making semiconductor structures that provide good gap filling performance while maintaining a good barrier against moisture and mobile ions.

SUMMARY OF THE INVENTION

Broadly speaking, the present invention fills these needs by providing methods and apparatuses for making a semiconductor structure having a moisture and mobile ion blocking passivation layered structure. It should be appreciated that the present invention can be implemented in numerous ways, including as a process, an apparatus, a system, a device, or a method. Several inventive embodiments of the present invention are described below.

In one embodiment, a method for making a passivation coated semiconductor structure is disclosed. The method includes providing a substrate and forming a metallization line over the substrate. The metallization line defining at least one interconnect feature having a first thickness, and depositing a first silicon nitride barrier layer having a second thickness over the substrate and the metallization line. The method further including applying an oxide material over the first silicon nitride barrier layer that overlies the substrate and the metallization line. The oxide application includes a deposition component and a sputtering component, and the sputtering component is configured to remove at least a part of an edge of the first silicon nitride layer. The edge is defined by the metallization line underlying the first silicon nitride layer. Further, the method includes depositing a second silicon nitride layer over the oxide material that is applied by the deposition component and the edge of the first silicon nitride layer sputtered by the sputtering component to establish a moisture repelling barrier between the second and first silicon nitride layers.

In another embodiment, a semiconductor structure having a moisture blocking passivation layer is disclosed. The semiconductor structure includes a semiconductor substrate having at least one metallization line pattered over the substrate. The at least one metallization line having a top surface and transition edges leading to the semiconductor substrate, and the metallization line preferably has a first thickness measured between the semiconductor substrate surface and the top surface of the at least one metallization line. Further, a first silicon nitride barrier layer is defined over the semiconductor substrate and the at least one metallization line that is patterned over the substrate. An oxide material is defined over the first silicon nitride barrier layer that lies over the semiconductor substrate and the top surface of the at least one metallization line having the first silicon nitride barrier layer, and the transition edges of the at least one metallization line do not have the oxide material defined over the silicon nitride barrier layer. The semiconductor structure further includes a second silicon nitride barrier layer that is defined over the oxide material such that a moisture path barrier is established at the transition edges where the first silicon nitride barrier layer meets the second silicon nitride barrier layer.

Advantageously, by forming a multi-layer passivation layer over a semiconductor substrate, moisture or mobile ions are blocked from entering into the oxide layer and migrating to the gate oxides of active devices formed on the semiconductor substrate. When the gate oxides of the active devices are blocked from moisture and mobile ions, the stability of the active devices is better maintained by reducing variations in turn-on threshold voltages of the active devices. In addition, by effectively blocking the possible moisture paths near and around via contact holes, moisture induced oxide cracking which may render the semiconductor integrated circuit useless is substantially prevented. Further yet, by providing a well sealed multi-layer passivation layer in accordance with one embodiment of the present invention, the semiconductor integrated circuit may be packaged as a smaller unit without the need for expensive hermetically sealed package structures. Other aspects and advantages of the invention will become apparent from the following detailed description, taken in conjunction with the accompanying drawings, illustrating by way of example the principles of the invention.

BRIEF DESCRIPTION OF THE DRAWINGS

The present invention will be readily understood by the following detailed description in conjunction with the accompanying drawings, wherein like reference numerals designate like structural elements, and in which.

DETAILED DESCRIPTION OF THE PREFERRED EMBODIMENTS

An invention for a semiconductor structure having a moisture and mobile ion blocking passivation layer and method for making the same is disclosed. In the following description, numerous specific details are set forth in order to provide a thorough understanding of the present invention. It will be understood, however, to one skilled in the art, that the present invention may be practiced without some or all of these specific details. In other instances, well known process operations have not been described in detail in order not to unnecessarily obscure the present invention.

Figure 2A:
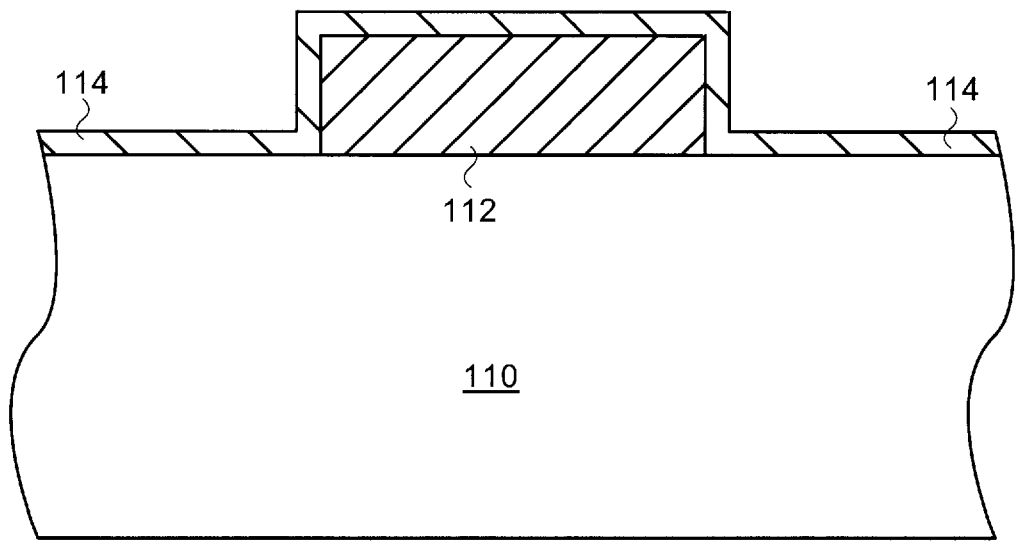
FIG. 2A is a cross-sectional view of a semiconductor substrate having a metallization line patterned thereon in accordance with one embodiment of the present invention.

FIG. 2A is a cross-sectional view of a semiconductor substrate 110 having a metallization line 112 patterned thereon in accordance with one embodiment of the present invention. Once metallization line 112 has been patterned to define the desired feature geometries, a silicon nitride layer 114 is deposited over semiconductor substrate 110 as well as metallization line 112. Although metallization line 112 is shown formed directly over semiconductor substrate 110, it should be appreciated that other layers such as insulating dielectric oxides may be fabricated between semiconductor substrate 110 and metallization line 112. In one embodiment, for a 0.25 micron process technology, the preferred thickness of silicon nitride layer 114 is preferably between about 1,000 angstroms and about 2,000 angstroms, and more preferably between about 1,250 angstroms and about 1,750 angstroms, and most preferably about 1,500 angstroms. In general, the objective is to deposit nitride layer 114 thick enough to provide a good moisture repelling barrier while ensuring that pinch-off does not occur between minimum feature gaps.

In another embodiment, for a 0.35 micron process technology, the thickness of silicon nitride layer 114 is preferably between about 1,000 angstroms and 3,000 angstroms, and more preferably between about 1,750 angstroms and about 2,500 angstroms, and most preferably about 2,000 angstroms. These thicknesses should be considered exemplary, and may vary depending on the process technology being implemented. Accordingly, it is envisioned other suitable thicknesses may be used for 0.18 micron, 0.15 micron, and 0.12 micron process technologies. Once the silicon nitride layer 114 has been deposited to the desired thickness over metallization line 112 and semiconductor substrate 110, an oxide material is deposited over silicon nitride layer 114.

Figure 2B:
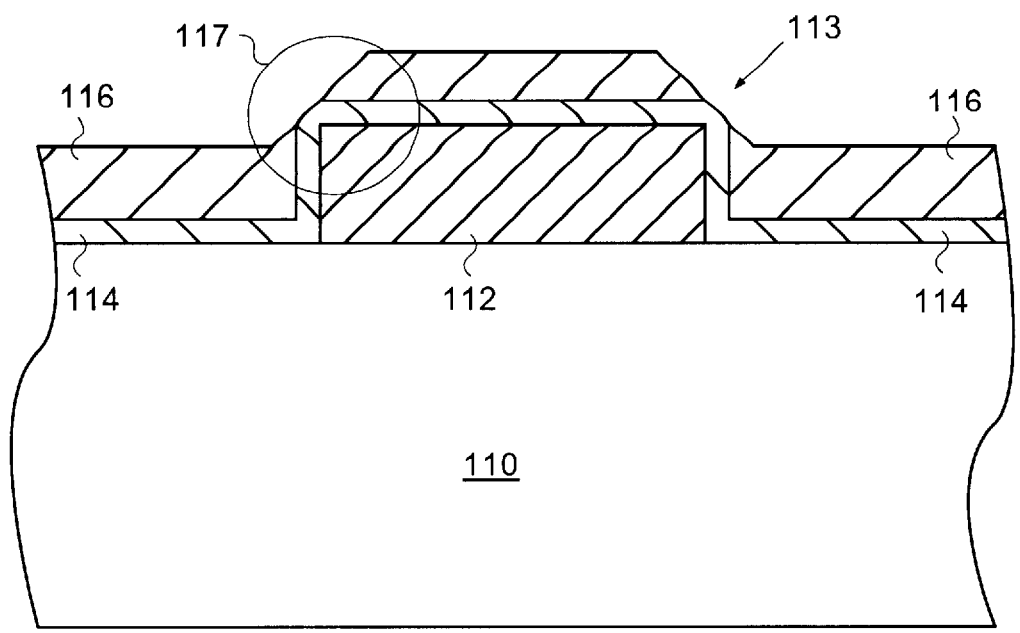
FIG. 2B is a cross-sectional view of FIG. 2A after an oxide layer has been deposited over silicon nitride layer using an HDPCVD deposition process in accordance with one embodiment of the present invention.

FIG. 2B is a cross-sectional view of FIG. 2A after an oxide layer 116 has been deposited over silicon nitride layer 114 using an HDPCVD deposition process in accordance with one embodiment of the present invention. As described above, oxide layer 116 will generally exhibit a superior gap filling capability which advantageously avoids producing gaps between closely spaced features. Further, because the HDPCVD process includes both a deposition component as well as a sputtering component (e.g., Argon bombardment or the like), when oxide layer 116 is applied over silicon nitride layer 114, the surface topographies will either be affected by a dominant deposition component or a dominant sputtering component.

By way of example, region 117 illustrates a topographical edge in the silicon nitride layer 114 which coats an underlying edge of metallization line 112. As such, an increased level of sputtering and a decreased level of oxide deposition will occur at a topographical edge 113 defined on the surface of silicon nitride layer 114. In a like manner, a increased level of deposition and a decreased level of sputtering will occur over regions that are perpendicular to the direction of deposition.

Figure 2C:
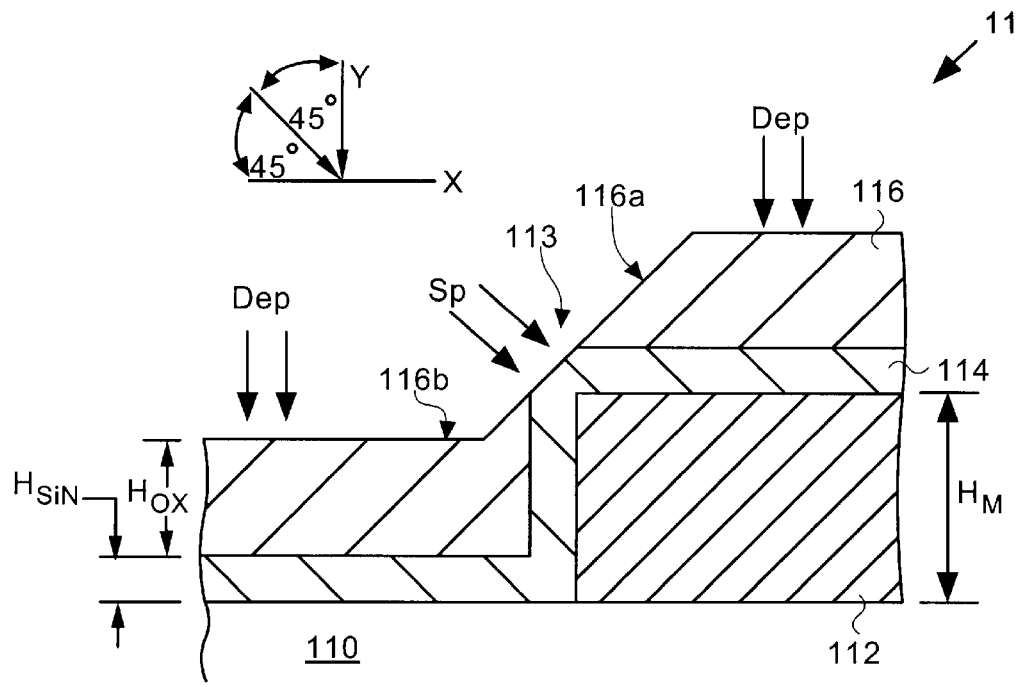
FIG. 2C is a magnified view of a region illustrating an increased sputtering component (Sp) at a topographical edge of a silicon nitride layer in accordance with one embodiment of the present invention.

FIG. 2C is a magnified view of region 117 illustrating the increased sputtering component (Sp) at topographical edge 113 of the silicon nitride layer 114 in accordance with one embodiment of the present invention. In general, increased sputtering component (Sp) is believed to occur at topographical edge 113 because an angle of about 45 degrees is formed when a tangent is measured at the topographical edge 113. Further, because the tangent defined over the non-corner surfaces is about perpendicular to the direction of deposition, less sputtering occurs and the deposition component (Dep) will be a dominant factor. Accordingly, in one embodiment of the present invention the HDPCVD oxide deposition is performed such that at least some of the topographical edge 113 of the silicon nitride layer 114 remains after the sputtering component (Sp) removes the semi-sharp topographical edge 113. This is generally accomplished by tuning the HDPCVD oxide deposition such that the deposition component at the topographical edge 113 is either zero or slightly negative, while the net deposition is still positive over the reset of the topography.

Figure 1A:
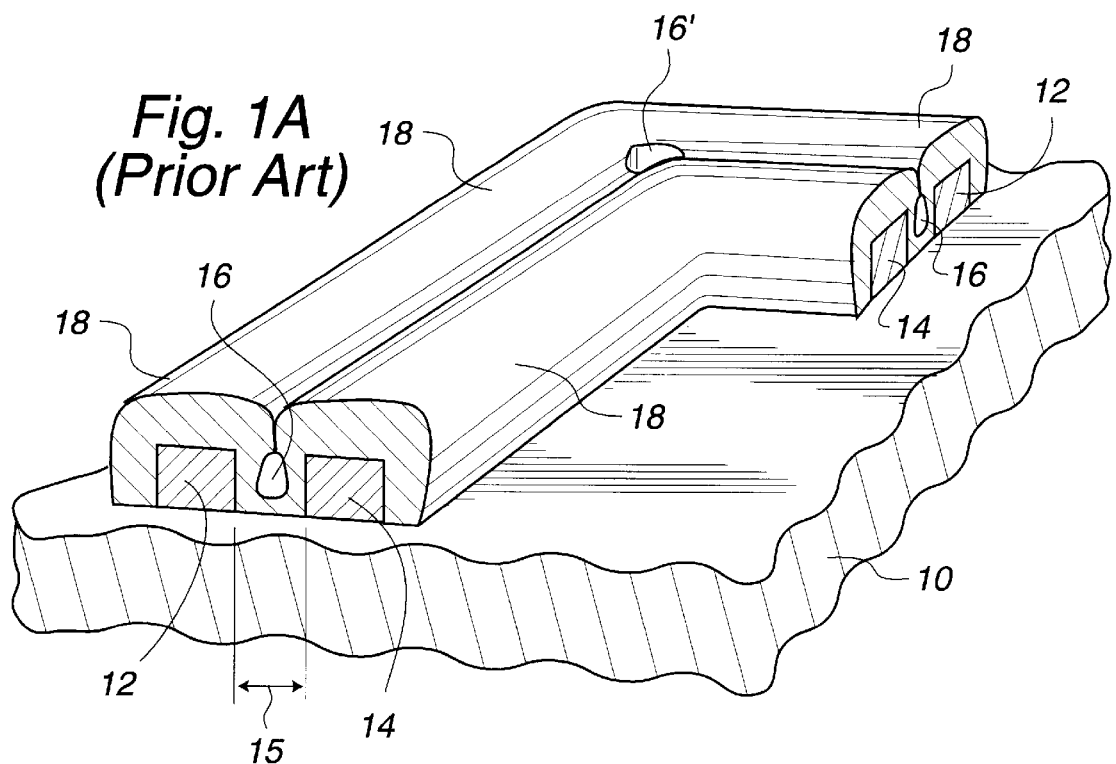
FIG. 1A is a three-dimensional view of a substrate having a passivation layer blanketed over a pair of metallization lines.
Figure 1B:
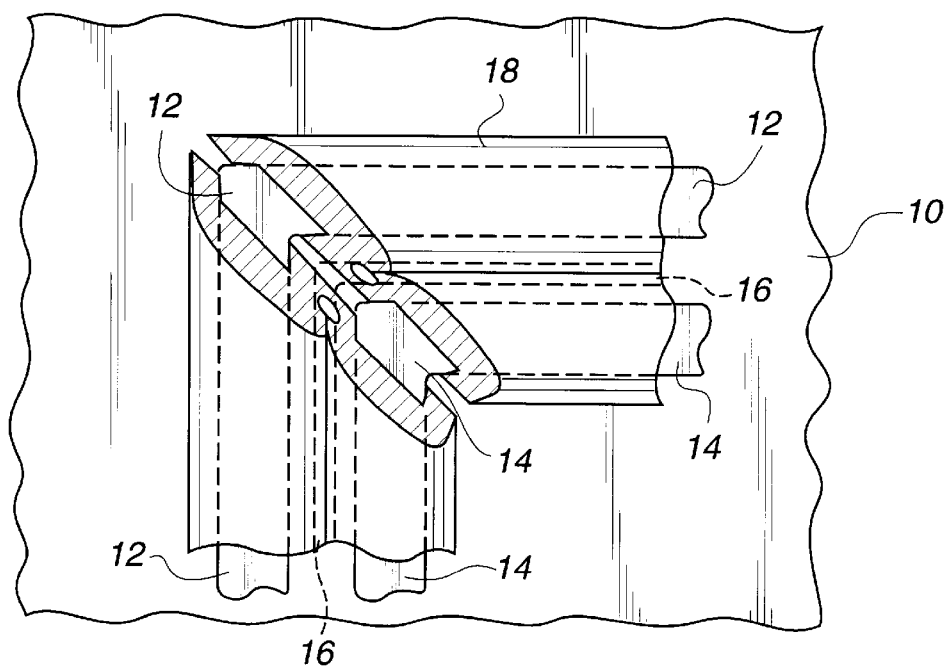
FIG. 1B is a top view of the damaged passivation layer that blankets the metallization lines of FIG. 1A.
Figure 1C:
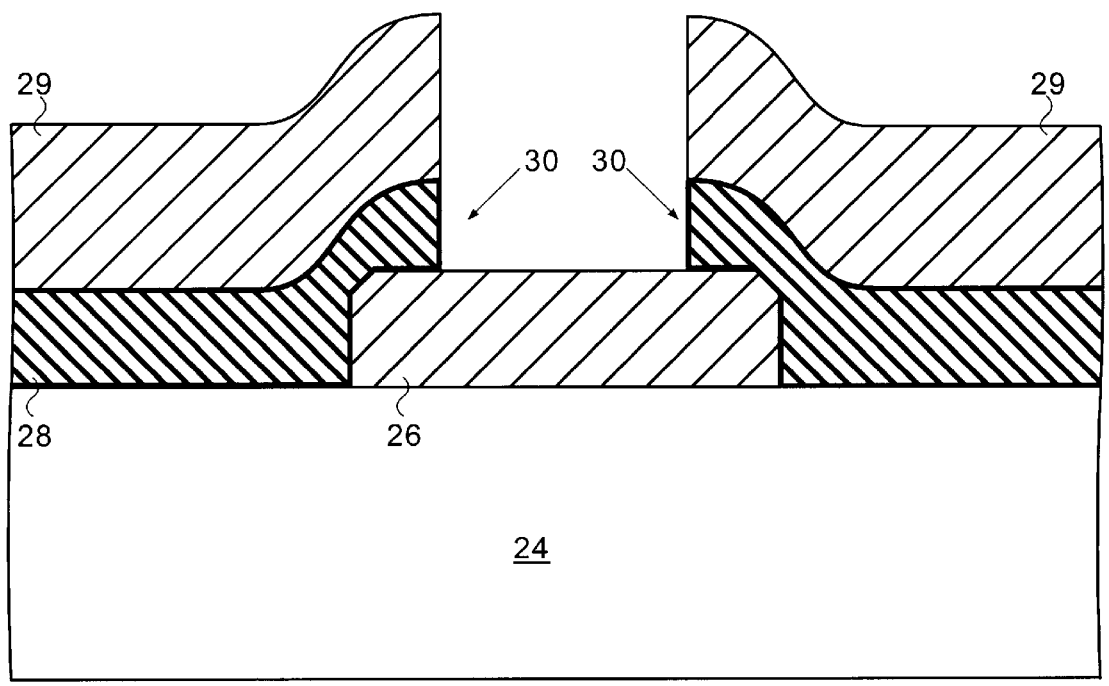
FIG. 1C is a cross-sectional view of a semiconductor device having an oxide layer deposited using an HDPCVD process to prevent possible pinch-offs between closely spaced apart features.

To ensure that a moisture and mobile ion path is substantially eliminated once a contact path is etched down to metallization line 112 as described in FIG. 1C above, the preferred combined height of ($H_{ox}$) and ($H_{SiN}$) of oxide layer 116 and silicon nitride layer 114, respectively, is between about 65 percent and about 90 percent of a height ($H_m$) of metallization line 112. More preferably, the combined heights of the oxide layer 116 and the silicon nitride layer 114 (i.e., $H_{ox}+H_{SiN}$) is between about 70 percent and about 85 percent of the height ($H_m$) of metallization line 112, and most preferably $H_{ox}+H_{SiN}$ is about 80 percent of $H_m$. It should be understood that references made to "height" and "thickness" similarly represents the amount of material that is preferably applied to a particular surface.

In this manner, a physical separation is created between an oxide region 116a and an oxide region 116b of the deposited oxide layer 116. By maintaining this physical separation, a subsequently deposited silicon nitride layer 118 shown in FIG. 2D below will define a moisture tight seal by the substantially direct contact of silicon nitride layer 114 and 118 at the topographical edge 113. It is also significant to note that by preferably maintaining the combined heights of $H_{ox}$ and $H_{SiN}$ to between 65 percent and 90 percent of $H_m$, the aforementioned pinch-off problems of the subsequently deposited silicon nitride layer 118 is avoided.

In a preferred 0.25 process technology embodiment, the preferred thickness (i.e., $H_m$) of metallization line 112 is between about 6,000 angstroms and about 10,000 angstroms, and more preferably between about 7,000 angstroms and about 9,000 angstroms, and most preferably, about 8,000 angstroms. Further, the preferred thickness (i.e., $H_{ox}$) of oxide layer 116 is between about 3,000 angstroms, and about 8,000 angstroms, and more preferably between about 4,500 angstroms, and 6,000 angstroms, and most preferably, about 5,500 angstroms.

Figure 2D:
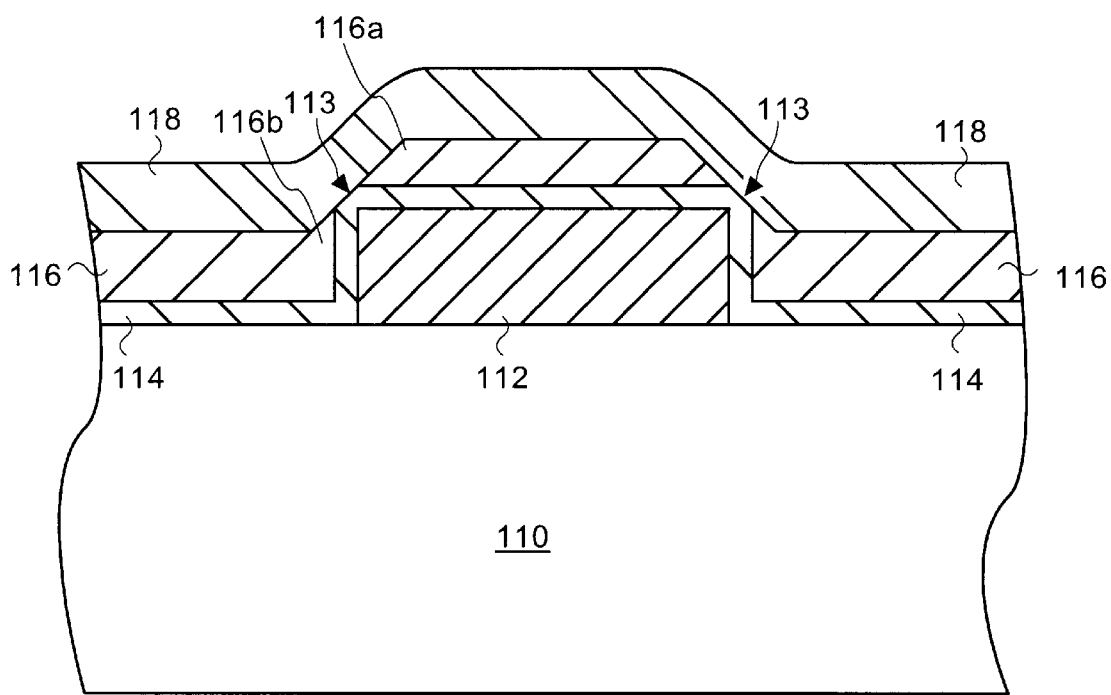
FIG. 2D is a cross-sectional view of the semiconductor substrate of FIG. 2B after a silicon nitride layer is deposited over an HDPCVD oxide layer 116 in accordance with one embodiment of the present invention.

FIG. 2D is a cross-sectional view of the semiconductor substrate of FIG. 2B after a silicon nitride layer 118 has been deposited over oxide layer 116, and the exposed topographical edge 113 of silicon nitride layer 114 in accordance with one embodiment of the present invention. As mentioned earlier, it is important to realize that silicon nitride layer 118 and silicon nitride layer 114 have essentially formed a moisture tight barrier at topographical edge 113, which is also well suited to substantially prevent mobile ions from migrating down to oxide region 116b of oxide layer 116. In addition, because oxide layer 116 was deposited using an HDPCVD process, the problems associated with pinch-off voids and resist trapping are similarly avoided.

Although any suitable thickness of silicon nitride layer 118 may be applied depending on a number of factors, including the integrated circuit's application, the number of additional layers being formed over nitride layer 118, etc., a preferred thickness may be between about 3,000 angstroms and about 15,000 angstroms, and most preferably, about 6,000 angstroms. Once the silicon nitride layer 118 has been deposited as shown, the top surface of silicon nitride layer 118 is patterned with a photoresist mask (not shown) to facilitate a subsequent etching step to expose a contact path down to metallization line 112.

Figure 2E:
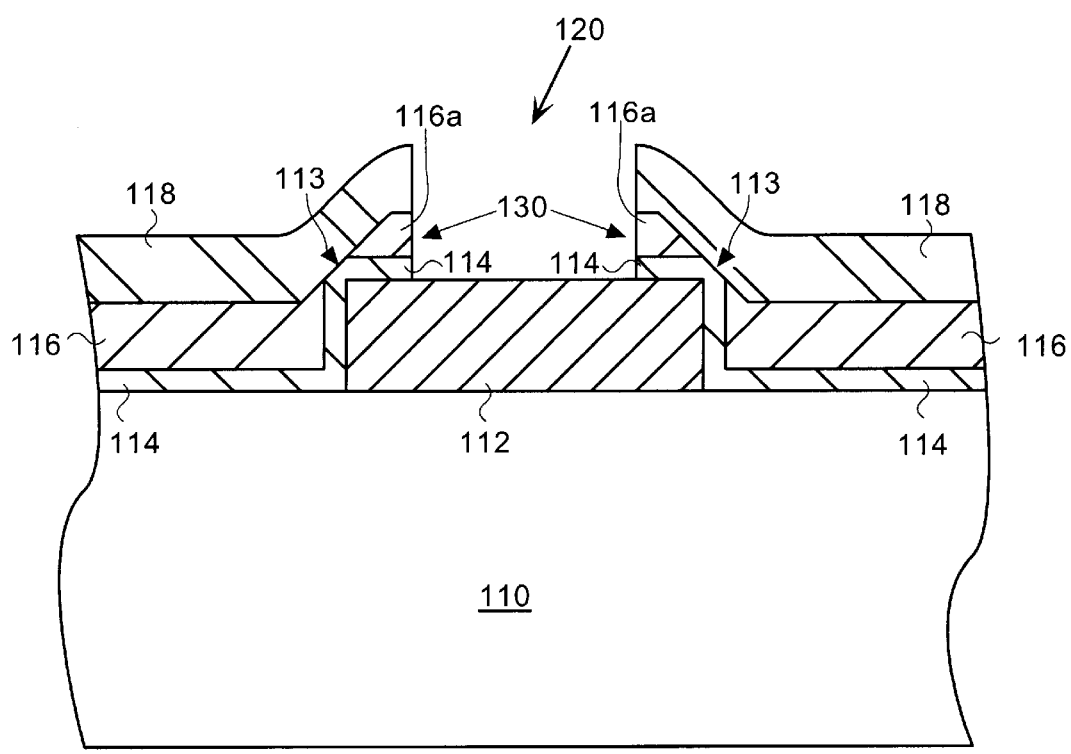
FIG. 2E shows a semiconductor structure after a dry plasma etching process is used to define a contact hole down to a metallization line in accordance with one embodiment of the present invention.

FIG. 2E shows the resulting structure after a dry plasma etching process is used to define a contact 120 down to metallization line 112 in accordance with one embodiment of the present invention. In this embodiment, once contact 120 has been defined down to metallization line 112, no moisture or mobile ion path 130 advantageously exists to oxide layer 116. Although it is possible that some moisture may penetrate into oxide region 116a, that moisture will not be allowed to bypass the moisture repelling barrier created by silicon nitride layer 114 and 118 at topographical edge 113. Accordingly, by preventing moisture from entering into oxide layer 116, fewer moisture induced variations in turn-on threshold voltage will occur in active devices formed through out a semiconductor integrated circuit. In addition, when moisture is blocked out of oxide layer 116, the dangers of oxide cracking and weakening is also advantageously prevented, thereby increasing the high performance useful life of a semiconductor integrated circuit.

Figure 3A:
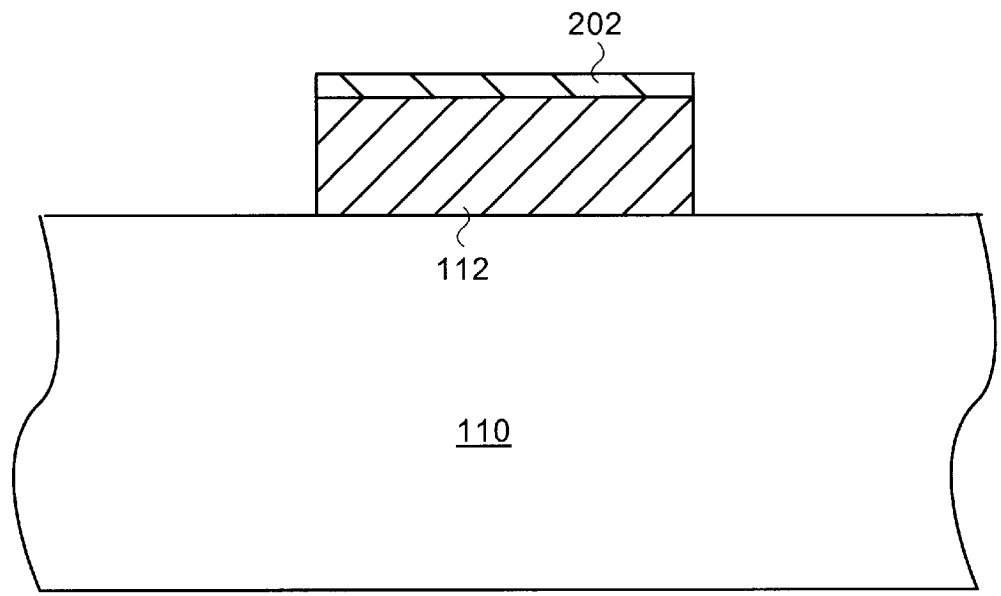
FIGS. 3A through 3D show semiconductor structures employing a hard mask and an HDPCVD oxide layer to define a moisture barrier in accordance with one alternative embodiment of the present invention.
Figure 3B:
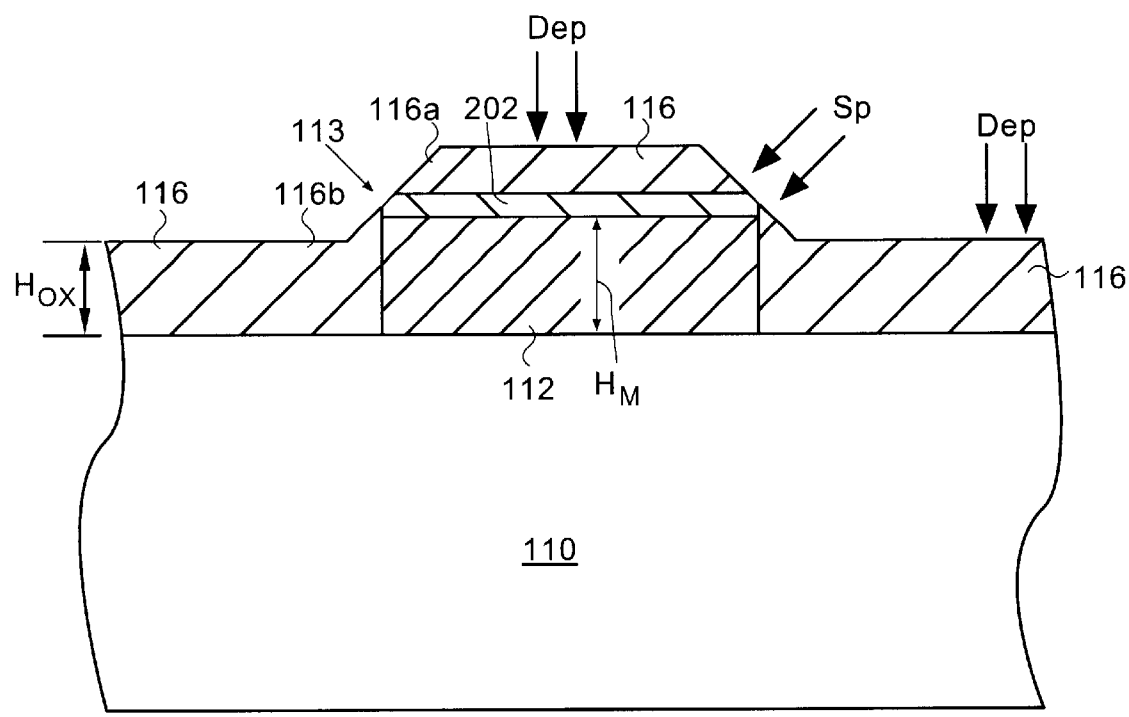

FIG. 3A is a cross-sectional view of a semiconductor substrate 110 having a metallization line 112 and a hard mask 202 in accordance with an alternative embodiment of the present invention. In this embodiment, hard mask 202 is preferably composed of a moisture repelling material, which may be for example, silicon nitride, silicon oxy-nitride. Once hard mask 202 has been patterned over a metallization layer to form metallization line 112, an oxide layer 116 is deposited using an HDPCVD deposition process as shown in FIG. 3B. As mentioned earlier, the HDPCVD deposition method typically includes a deposition component (Dep) and a sputter component (Sp) that are preferably tuned to ensure that the deposition component (Dep) at a topographical edge 113 is either zero or slightly negative, while the net deposition is still positive over the reset of the topography.

Therefore, at the topographical edge 113 of hard mask 202, the sputtering component is greatest which acts to remove a portion of the semi-sharp corner edge of the silicon nitride hard mask 202. Meanwhile, the deposition component (Dep) is leaving oxide layer 116 over the flat regions of the semiconductor substrate 110 and the flat regions of hard mask 202. The oxide material 116 is then deposited such that the height ($H_{ox}$) of the oxide layer 116 is between about 65 percent and about 90 percent of the height ($H_m$) of the metallization line 112. More preferably, $H_{ox}$ is between about 70 percent and 85 percent of $H_m$, and most preferably, $H_{ox}$ is about 80 percent of $H_m$.

In this embodiment, metallization line 112 is preferably between about 6,000 angstroms and about 10,000 angstroms, and more preferably between 7,000 angstroms and about 9,000 angstroms, and most preferably about 8,000 angstroms for 0.25 micron process technology. Of course, these thicknesses are merely exemplary, and other thicknesses may be used for smaller and larger process technologies.

In one embodiment, it is important that the sputtering component of the applied HDPCVD oxide layer 116 will not unduly erode the corner of the hard mask 102, which is well suited to provide a moisture seal after a subsequent etching step has been performed to define a contact path down to metallization line 112. That is, although the benefits of providing a moisture barrier between oxide regions 116a and 116b will still be possible if the hard mask 202 is removed at the topographical edge 113, careful attention should be placed on preventing the edge of metallization 112 from being sputtered off. Accordingly, if the metallization layer is sputtered off by the argon bombardment, the sputtered edge may be re-deposited in a gap between features. When this happens, performance reducing metal leakage currents may be introduced.

Figure 3C:
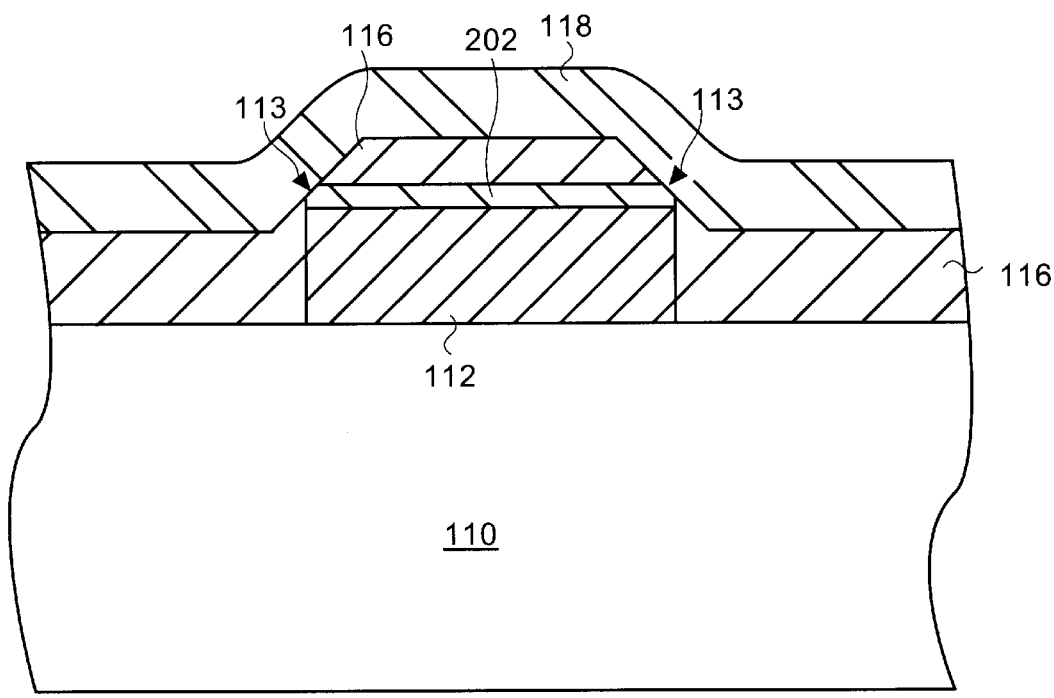

FIG. 3C shows the semiconductor device of FIG. 3B after a silicon nitride layer 118 has been deposited over oxide layer 116 and the topographical edge 113 of hard mask 202. As described above, the preferred thickness of silicon nitride layer 118 may vary depending on the particular integrated circuit application being designed, however, in a preferred 0.25 micron process technology application, the thickness of silicon nitride layer 118 may be between about 3,000 angstroms and about 15,000 angstroms, and most preferably about 6,000 angstroms.

Figure 3D:
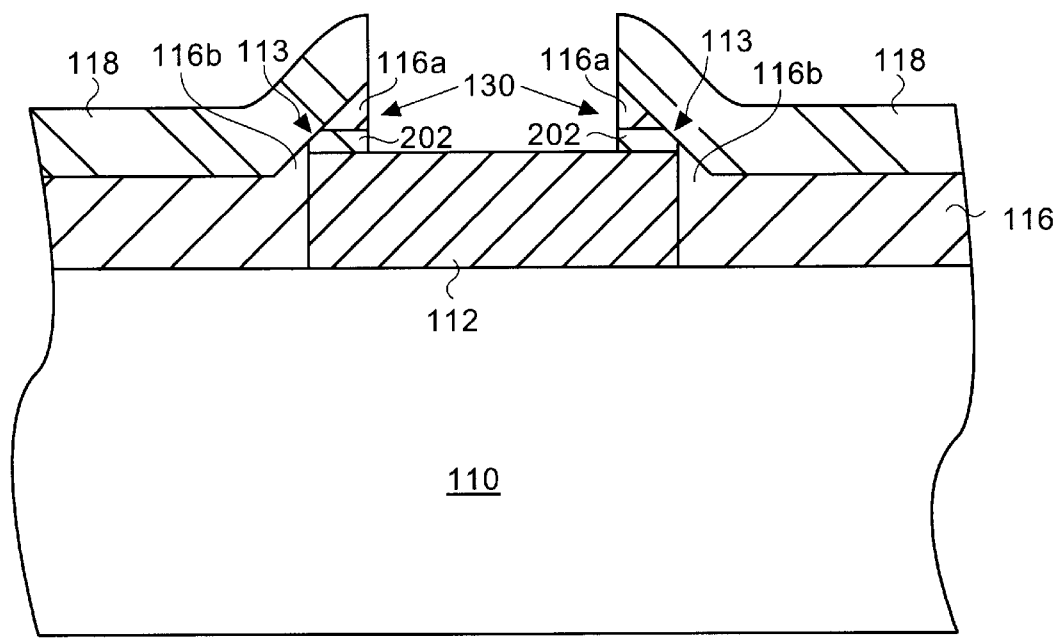

FIG. 3D shows the resulting structure after a mask and dry plasma etching step has been performed to define a path down to metallization line 112 in accordance with one embodiment of the present invention. As is the case with the structure of FIG. 2E, the possible moisture and mobile ions are blocked at a path 130. It should be appreciated that the moisture and mobile ion path is blocked by the barrier formed between hard mask 202 and silicon nitride layer 118. When this barrier is formed, any moisture that may contact an oxide region 116a will not be allowed to bypass the moisture repelling barrier and flow to an oxide region 116b.

Figure 4A:
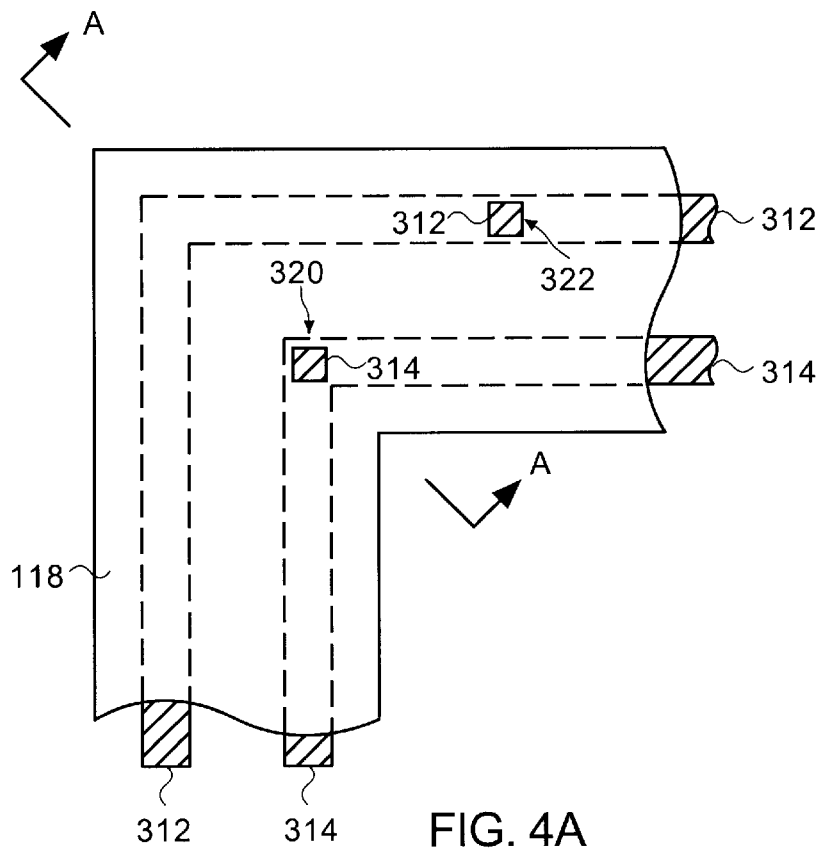
FIG. 4A is a top view of a pair of metallization lines being protected by a passivation system in accordance with one embodiment of the present invention.

FIG. 4A is a top view of a pair of metallization lines 312 and 314 being protected by a passivation system in accordance with one embodiment of the present invention. As shown, a silicon nitride layer is deposited over an oxide layer 116 as well as a corner region of an underlying silicon nitride layer 114. As described above, the formation of oxide layer 116 includes both a deposition (Dep) component and a sputtering component (Sp) that ensures that the oxide layer 116 is not deposited over a topographical edge 313. In this manner, when the silicon nitride layer 118 is deposited over oxide layer 116, a moisture repelling barrier is established at topographical edge 313 when a contact hole is made down to an underlying metallization line.

By way of example, if contact via holes 320 and 322 are etched down to metallization lines 314 and 312 respectively, moisture and mobile ions will not be allowed to migrate into oxide layer 116. As mentioned earlier, preventing moisture migration into oxide layer 116 advantageously prevents possible variations in turn-on threshold voltages if the moisture or mobile ions migrate to neighboring gate oxides of active devices. In addition, it should be appreciated that using an excellent gap filling HDPCVD oxide deposition process to apply oxide layer 116, the pinch-off problems of the prior art are avoided. Thus, the passivation layers preferably remain substantially intact throughout the fabrication process since photoresist trapping holes are no longer a problem at 90 degree angles (or any other hole inducing angles). Accordingly, when the photoresist material is prevented from flowing into pinch-off regions, the typical high temperature annealing steps will not cause the damaging outgassing that destroys the passivation layers at cross-section A—A.

Figure 4B:
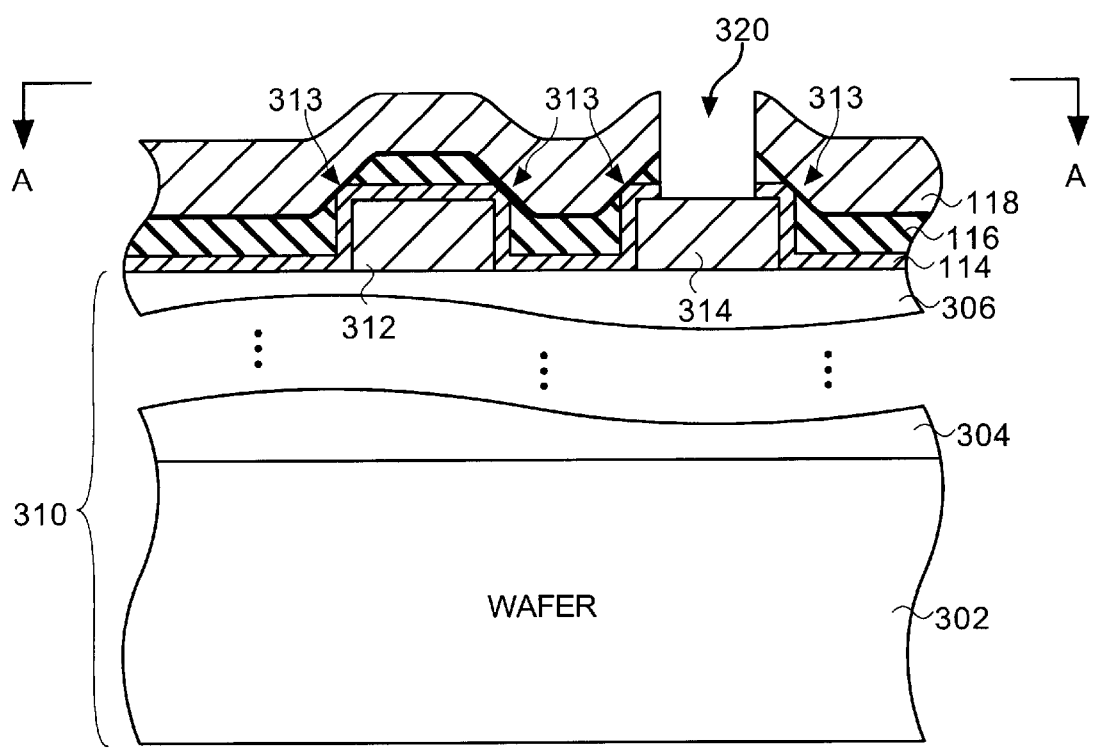
FIG. 4B is a cross sectional view of a cross-section A—A of FIG. 4A in accordance with one embodiment of the present invention.

FIG. 4B is a cross sectional view of FIG. 4A across cross-section A—A in accordance with one embodiment of the present invention. In this embodiment, the passivation layers including silicon nitride layer 114, oxide layer 116 and silicon nitride layer 118 will advantageously prevent pinch-off voids between narrowly spaced features (i.e., metallization lines 312 and 312) as well as providing a moisture and mobile ion barrier at topographical edges 313. For illustrative purposes, a semiconductor substrate 310 may be a multi-layer substrate including a wafer 302.

In sum, preventing moisture and mobile ions from entering into oxide layer 116 will prevent variations in turn-on threshold voltages in active devices formed through out a semiconductor integrated circuit. Further, when moisture is blocked out of oxide layer 116, the dangers of oxide cracking are also advantageously reduced, thereby increasing the life of a semiconductor integrated circuit. Further yet, by providing well sealed passivation layers, devices may be packaged as smaller units that may not need to be hermetically sealed.

As is well known in the art, wafer 302 may include hundreds of identical chips, each having thousands or millions of active devices (i.e., transistor source and drain wells and pattern gates). Of course, a multitude of interconnect lines (not shown) and a multitude of electrical interconnect contact vias may also be formed in layer 304 and layer 306. As such, metallization lines 312 and 314 may be formed on any number of metallization levels that may include a first metallization level, a second metallization level, . . . a fifth metallization level, etc.

Although the foregoing invention has been described in some detail for purposes of clarity of understanding, it will be apparent that certain changes and modifications may be practiced within the scope of the appended claims. Accordingly, the present embodiments are to be considered as illustrative and not restrictive, and the invention is not to be limited to the details given herein, but may be modified within the scope and equivalents of the appended claims.

What is claimed is:

1. A semiconductor structure having a moisture blocking passivation layer, comprising:

a semiconductor substrate having at least one metallization line pattered over the substrate, the at least one metallization line having a top surface and transition edges leading to the semiconductor substrate, the at least one metallization line having a first thickness defined between the semiconductor substrate to the top surface of the at least one metallization line;

a first silicon nitride barrier layer defined over the semiconductor substrate and the at least one metallization line that is patterned over the substrate;

a oxide material defined over the first silicon nitride barrier layer that lies over the semiconductor substrate and the top surface of the at least one metallization line having the first silicon nitride barrier layer, and the transition edges of the at least one metallization line do not have the oxide material defined over the silicon nitride barrier layer; and a second silicon nitride barrier layer defined over the oxide material such that a moisture path barrier is established at the transition edges where the first silicon nitride barrier layer meets the second silicon nitride barrier layer.

2. A semiconductor structure having a moisture blocking passivation layer as recited in claim 1, wherein the first silicon nitride barrier layer has a second thickness that is less than between about 90 percent of the first thickness of the at least one metallization line.

3. A semiconductor structure having a moisture blocking passivation layer as recited in claim 2, wherein the oxide material defined over the first silicon nitride barrier layer that lies over the semiconductor substrate and the top surface of the at least one metallization line has a third thickness that is less than about 90 percent of the first thickness of the at least one metallization line.

4. A semiconductor structure having a moisture blocking passivation layer as recited in claim 3, wherein the second thickness and the third thickness lying over the semiconductor substrate is cumulatively less than about 90 percent of the first thickness.

5. A semiconductor structure having a moisture blocking passivation layer as recited in claim 4, wherein when the second thickness and the third thickness are cumulatively less than about 90 percent of the first thickness, the oxide material is prevented from forming over the transition edges of the at least one metallization line.

6. A semiconductor structure having a moisture blocking passivation layer as recited in claim 5, wherein the first silicon nitride barrier layer has a thickness of between about 1,000 angstroms and about 2,000 angstroms.

7. A semiconductor structure having a moisture blocking passivation layer as recited in claim 6, wherein the at least one metallization line having a first thickness is between about 6,000 angstroms and about 10,000 angstroms.

8. A semiconductor structure having a moisture blocking passivation layer as recited in claim 7, wherein the second silicon nitride layer has a thickness that is between about 3,000 angstroms and about 15,000 angstroms.

9. A apparatus for fabricating a multi-layered passivation material over a semiconductor substrate, comprising:

means for forming a metallization line over the substrate, the metallization line defining at least one interconnect feature having a first thickness;

means depositing a first silicon nitride barrier layer having a second thickness over the substrate and the metallization line;

means for applying an oxide material over the first silicon nitride barrier layer that overlies the substrate and the metallization line, the oxide application includes a deposition component and a sputtering component, the sputtering component being configured to remove at least a part of an edge of the first silicon nitride layer, the edge being defined by the metallization line underlying the first silicon nitride layer; and means for depositing a second silicon nitride layer over the oxide material that is applied by the deposition component and the edge of the first silicon nitride layer sputtered by the sputtering component to establish a substantially pinch-off free oxide fill having a moisture repelling barrier between the second and first silicon nitride layers.

10. A apparatus for fabricating a multi-layered passivation material over a semiconductor substrate as recited in claim 9, further comprising:

means for tuning the deposition component of the oxide material application to apply the oxide material to a third thickness such that the sum of the second thickness of the first silicon nitride layer and the third thickness of the oxide material is between about 65 percent and about 90 percent of the first thickness of the metallization line.

* * * * *